(12) United States Patent
Huang et al.

(10) Patent No.: US 8,405,788 B2
(45) Date of Patent: Mar. 26, 2013

(54) TFT-LCD ARRAY SUBSTRATE AND MANUFACTURING METHOD THEREOF

(75) Inventors: Yinglong Huang, Beijing (CN); Heecheol Kim, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 433 days.

(21) Appl. No.: 12/718,400

(22) Filed: Mar. 5, 2010

(65) Prior Publication Data

US 2010/0225860 A1 Sep. 9, 2010

(30) Foreign Application Priority Data

Mar. 6, 2009 (CN) .......................... 2009 1 0079295

(51) Int. Cl.
*G02F 1/1343* (2006.01)

(52) U.S. Cl. ............................... 349/39; 349/43; 349/48
(58) Field of Classification Search .................. None
See application file for complete search history.

(56) References Cited

U.S. PATENT DOCUMENTS

| 6,724,443 | B1 * | 4/2004 | Sano et al. ...................... 349/39 |
| 7,586,122 | B2 * | 9/2009 | You .................................. 257/59 |
| 2004/0094766 | A1 * | 5/2004 | Lee et al. ......................... 257/72 |
| 2009/0066869 | A1 * | 3/2009 | Wu et al. ......................... 349/39 |

* cited by examiner

*Primary Examiner* — Thanh-Nhan P Nguyen
(74) *Attorney, Agent, or Firm* — Ladas & Parry LLP

(57) ABSTRACT

A thin film transistor liquid crystal display (TFT-LCD) array substrate comprising a plurality of gate lines, a plurality of data lines and a plurality of common electrode lines. A plurality of pixel regions are formed by crossing of the plurality of gate lines and the plurality of data lines, a pixel electrode and a thin film transistor are provided for each pixel region, and one common electrode line is common to two vertically adjacent pixel regions.

4 Claims, 9 Drawing Sheets

A2 - A2

B2 - B2

US 8,405,788 B2

TFT-LCD ARRAY SUBSTRATE AND MANUFACTURING METHOD THEREOF

BACKGROUND

The present invention relates to a thin film transistor liquid crystal display (TFT-LCD) array substrate and a manufacturing method thereof.

Thin film transistor liquid crystal displays (TFT-LCDs) are widely used due to small volume, low power consumption and no radiation.

A TFT-LCD is formed by bonding together an array substrate and a color filter substrate. Regions defined by crossing of gate lines and data lines formed on the array substrate are regarded as pixel regions. FIG. 1 is a schematic plan view showing the configuration of a TFT-LCD array substrate, in which the structure of two vertically adjacent (along the vertical direction in the figures) pixel regions is shown. The main structure of the TFT-LCD comprises a gate line 11, a common electrode line 12, a data line 13, a pixel electrode 14, a light blocking bar 20 and a thin film transistor. A pixel region is defined by the gate line 11 and the data line 13 perpendicular to each other, and the thin film transistor and the pixel electrode 14 are formed in the pixel region. As shown in FIG. 1, for each pixel region, the light blocking bar 20 and the common electrode line 12 are collectively formed into a "Π" shape light blocking structure. Since the common electrode line 12 is made of a metal material which is non-transparent, the aspect ratio of the TFT-LCD is low so that the display brightness is low.

SUMMARY

The embodiment of the invention provides a thin film transistor liquid crystal display (TFT-LCD) array substrate comprising a plurality of gate lines, a plurality of data lines and a plurality of common electrode lines. A plurality of pixel regions are formed by crossing of the plurality of gate lines and the plurality of data lines, a pixel electrode and a thin film transistor are provided for each pixel region, and one common electrode line is common to two vertically adjacent pixel regions.

Another embodiment of the invention provides a manufacturing method of a thin film transistor liquid crystal display (TFT-LCD) array substrate, comprising:

Step 1 of depositing a gate metal film on a substrate, forming a gate line, a gate electrode and a common electrode line for each pixel region by patterning the gate metal film, wherein the common electrode line is common to two vertically adjacent pixel regions;

Step 2 of depositing a gate insulating layer, a semiconductor film, and a doped semiconductor film and a source/drain metal film on the substrate after Step 1, forming an active layer island, a data line, and a drain electrode, a source electrode and a thin film transistor (TFT) channel for each pixel region by patterning the gate insulating layer, the semiconductor film, the doped semiconductor film and the source/drain metal film;

Step 3 of depositing a passivation layer on the substrate after Step 2, forming a through hole in the passivation layer above the drain electrode by patterning the passivation layer; and Step 4 of depositing a transparent conductive film on the substrate after Step 3, forming a pixel electrode of each pixel region, which is connected with the drain electrode through the passivation through hole, by patterning the transparent conductive film.

A further scope of the invention will become apparent from the detailed description given hereinafter. However, it is understood that the detailed description and specific examples, while indicating preferred embodiments of the invention, are given with way of illustration only, since various changes and modifications within the spirit and scope of the invention will become apparent to those skilled in the art.

BRIEF DESCRIPTION OF THE DRAWING

The present invention will become more fully understood from the detailed description given hereinafter and the accompanying drawings which are given by way of illustration only, and thus are not limitative of the present invention and wherein.

DESCRIPTION OF THE PREFERRED EMBODIMENTS

Figure 1:
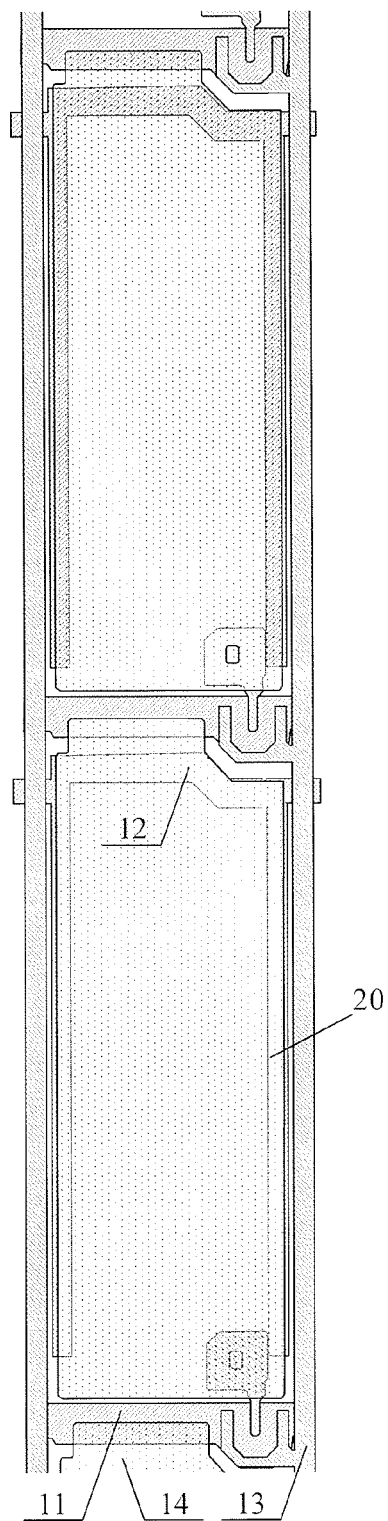
FIG. 1 is a schematic plan view showing a configuration of a TFT-LCD array substrate.
Figure 2:
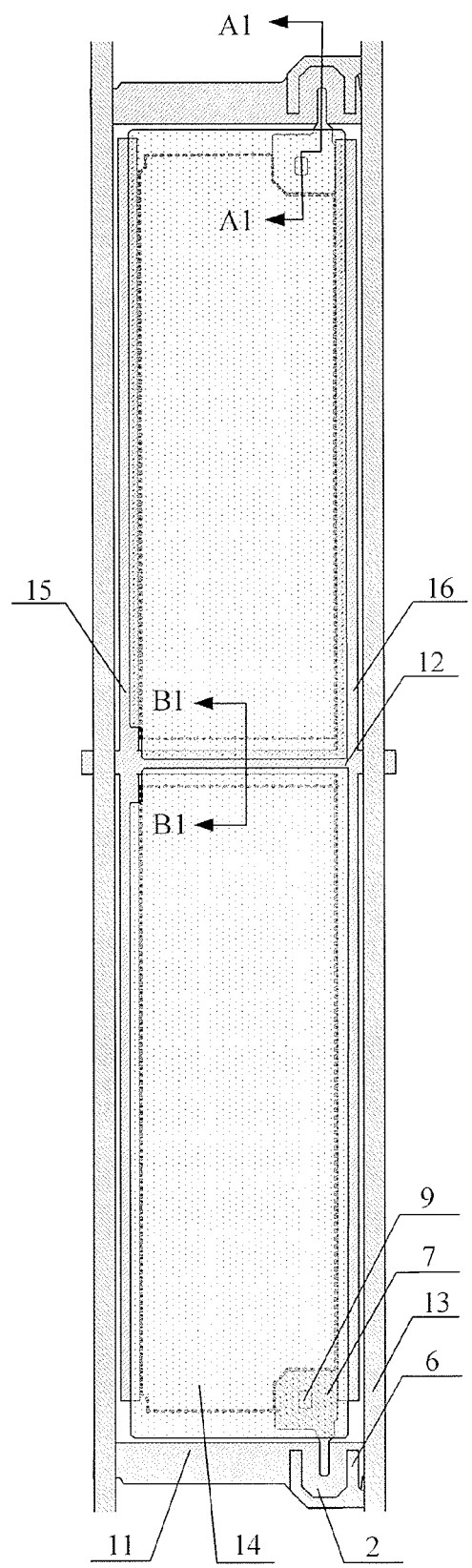
FIG. 2 is a schematic plan view showing a configuration of a TFT-LCD array substrate according to an embodiment of the invention.
Figure 3:
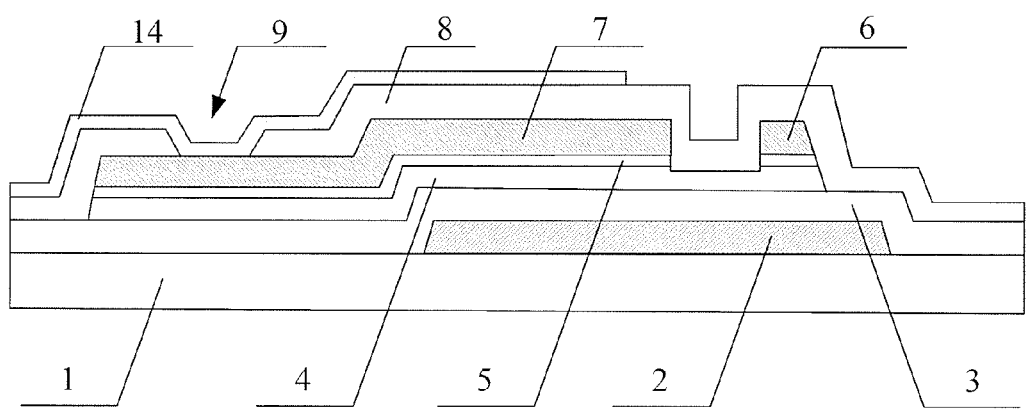
FIG. 3 is a cross-sectional view taken along line A1-A1 in FIG. 2.

FIG. 2 is a schematic plan view showing a configuration of a TFT-LCD array substrate according to an embodiment of the invention, which shows a structure of two vertically adjacent (along the vertical direction in the figure) pixel regions. FIG. 3 is a cross-sectional view taken along line A1-A1 in FIG. 2, and FIG. 4 is a cross-sectional view taken along line B1-B1 in FIG. 2.

Figure 4:
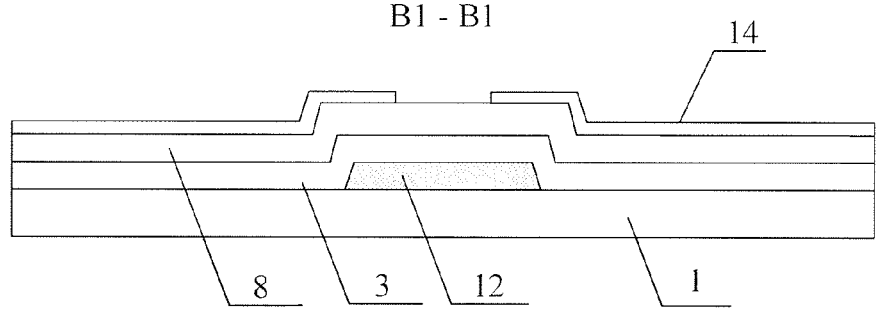
FIG. 4 is a cross-sectional view taken along line B1-B1 in FIG. 2.

As shown in FIG. 2-4, the TFT-LCD array substrate according to the embodiment of the invention comprises a plurality of gate lines 11, a plurality of data lines 13 and a plurality of common electrode lines 12 which are formed on a substrate 1. A pixel electrode and a thin film transistor are formed in each of a plurality of pixel regions, which are defined by crossing of the gate lines 11 and data lines 13, and one common electrode line 12 is commonly used for the two vertically adjacent pixel regions. The gate lines 11 are used to provide gate signals such as an ON signal to the thin film transistors, and the data lines 13 are used to provide data signals to the pixel electrodes 14.

The common electrode line 12 common to two vertically adjacent pixel regions comprises the following examples. For the two vertically adjacent pixel regions, the gate line 11 in the upper pixel region is located at the upper side of this pixel region; the gate line 11 in the lower pixel region is located at the lower side of this pixel region. The common electrode line 12, which is used for providing storage capacitance and common to the two pixel regions, is provided between the gate line 11 on the upper side of the upper pixel region and the gate line on the lower side of the lower pixel region. That is to say, the common electrode line 12 is disposed between the two gate lines, between which two corresponding pixel electrodes 14 are interposed. In one aspect, the common electrode line 12 extending laterally is used to provide storage capacitances together with the pixel electrodes 14 in the two vertically adjacent two pixel regions. In another aspect, the common electrode line 12 can be further connected with a first light blocking bar 15 and a second light blocking bar 16, which are vertically disposed on the two sides of the pixel regions so as to collectively form a light blocking structure.

Here, each thin film transistor (TFT) comprises a gate electrode 8, a gate insulating layer 3, a semiconductor layer 4, a doped semiconductor layer 5, a source electrode 6, a drain electrode 7 and a passivation layer 8. The gate electrode 2 is formed on the substrate 1 and connected with the gate line 11. The gate insulating layer 3 is formed on the gate electrode 2 and the gate line 11 so as to cover the whole substrate 1. The stack of the semiconductor layer 4 and the doped semiconductor layer 5 is formed into an active layer of an island shape, which is formed on the gate insulating layer 3 and above the gate electrode 2. The source electrode 6 and the drain electrode 7 are formed on the active layer island. One end of the source electrode 6 is above the gate electrode 2, and the other end is connected with the date line 13. One end of the drain electrode 7 is above the gate electrode 12, and the other end is connected with the pixel electrode 14 though a though hole 9 formed in the passivation layer 8. A TFT channel region is formed between the source electrode 6 and the drain electrode 7. The doped semiconductor layer 5 in the TFT channel region is etched away and the semiconductor layer 4 in the region is also partially etched in the thickness direction, so that the semiconductor layer 4 in the TFT channel region is exposed. The passivation layer 8 is formed on the data line 13, the source electrode 6 and the drain electrode 7 so as to cover the whole substrate 1. In the passivation layer 8, a though hole 9, though which the drain electrode 7 and the pixel electrode 14 are connected with each other, is provided at the location above the drain electrode 7. For the group including the two vertically adjacent pixel regions, the common electrode line 12 is between the gate lines 11 of the two vertically adjacent pixel regions and parallel with the gate lines 11. The first light blocking bar 15 and the second light blocking bar 16 are parallel with the data lines 13, while the first light blocking bar 15 is at the left side of the pixel regions and closer to the data line 13 at the left side of the pixel regions and the second light blocking bar 16 is at the right side of the pixel regions and closer to the data line 13 at the right side of the pixel regions. The common electrode line 12 is connected with the first light blocking bar 15 and the second light blocking bar 16 so that the integral structure comprising the common electrode line 12 and the first and second light blocking bar 15 and 16 forms a light blocking structure of a "Π" shape or a reversed "Π" shape for each pixel region. The pixel electrode 14 and the common electrode line 12 are overlapped with each other, so that the pixel electrode 14 and the common electrode line 12 form a structure of capacitance on common electrode line (Cst on Common).

In the embodiment of the invention, the common electrode line 12 is commonly used for the two vertically adjacent pixel regions so as to reduce the number of the common electrode line for two adjacent pixel regions to one. Since the common electrode line 12 is made of a metal material and not transparent, the reduction of one common electrode line contributes to improve the transparency of the pixel region. Therefore, the aspect ratio can be increased without adversely affecting the display performance. In addition, the power consumption of the backlight can be decreased without changing the display brightness.

FIGS. 5~13 are schematic views showing the manufacturing process of the TFT-LCD array substrate according to the embodiment of the invention. In reference to these figures, the embodiment of the invention is further described. Hereinafter, the so called patterning process may comprise the processes such as applying photoresist, masking, exposing and developing the photoresist, etching with the pattern of photoresist, lifting off the remained photoresist and the like, and the photoresist is described with a positive type photoresist as an example.

Figure 5:
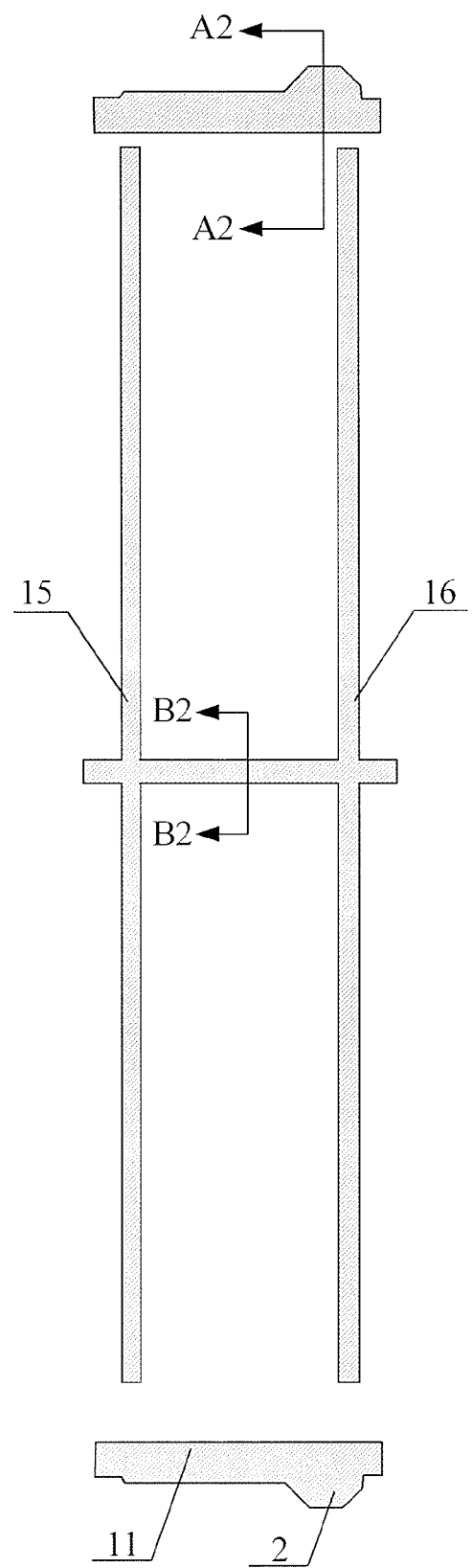
FIG. 5 is a plan view of the TFT-LCD array substrate after a first patterning process according to the embodiment of the invention.
Figure 6:
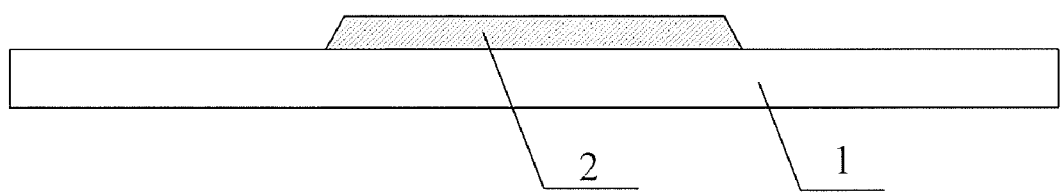
FIG. 6 is a cross-sectional view taken along line A2-A2 in FIG. 5.
Figure 7:
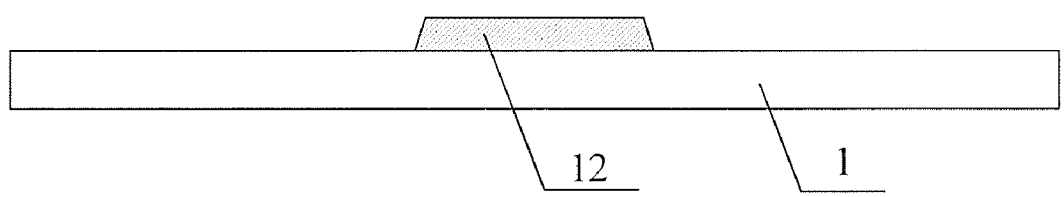
FIG. 7 is a cross-sectional view taken along line B2-B2 in FIG. 5.

FIG. 5 is a plan view of the TFT-LCD array substrate after a first patterning process according to the embodiment of the invention. FIG. 6 is a cross sectional view taken along the line A2-A2 in FIG. 5, and FIG. 7 is a cross sectional view taken along the line B2-B2 in FIG. 5.

Firstly, a gate metal film is deposited on a substrate 1 (such as a glass substrate or a silica substrate), for example, by a magnetic sputtering method or a thermal evaporation method. The gate metal film may be a single layer of a metal such as Mo and Al, or may be a composite film composed of multiple metal layers (e.g., Mo/Al/Mo composite film). The gate metal film is pattered with a normal mask so as to form a gate line 11, a gate electrode 2, a common electrode line 12, a first light blocking bar 15 and a second light blocking bar 16 for each pixel region, as shown in FIGS. 5-7. The common electrode line 12 is disposed between two vertically adjacent pixel regions and parallel with the gate lines 11 of the two pixel regions. The first light blocking bar 15 and the second light blocking bar 16 are parallel with data lines 13 of the two vertically adjacent pixel regions to be formed. The first light blocking bar 15 is at the left side of the pixel regions and closer to the data line 13 at the left side of the pixel regions, and the second light blocking bar 16 is at the right side of the pixel regions and closer to the data line 13 at the right side of the pixel regions. The common electrode line 12 is connected with the first light blocking bar 15 and the second light blocking bar 16 so that the integral structure comprising the common electrode line 16, the first and second light blocking bar 15 and 16 forms a light blocking structure of a "Π" shape or a reversed "Π" shape for each pixel region. That is to say, the two vertically adjacent pixel regions use the common electrode line 12 in common.

Figure 8:
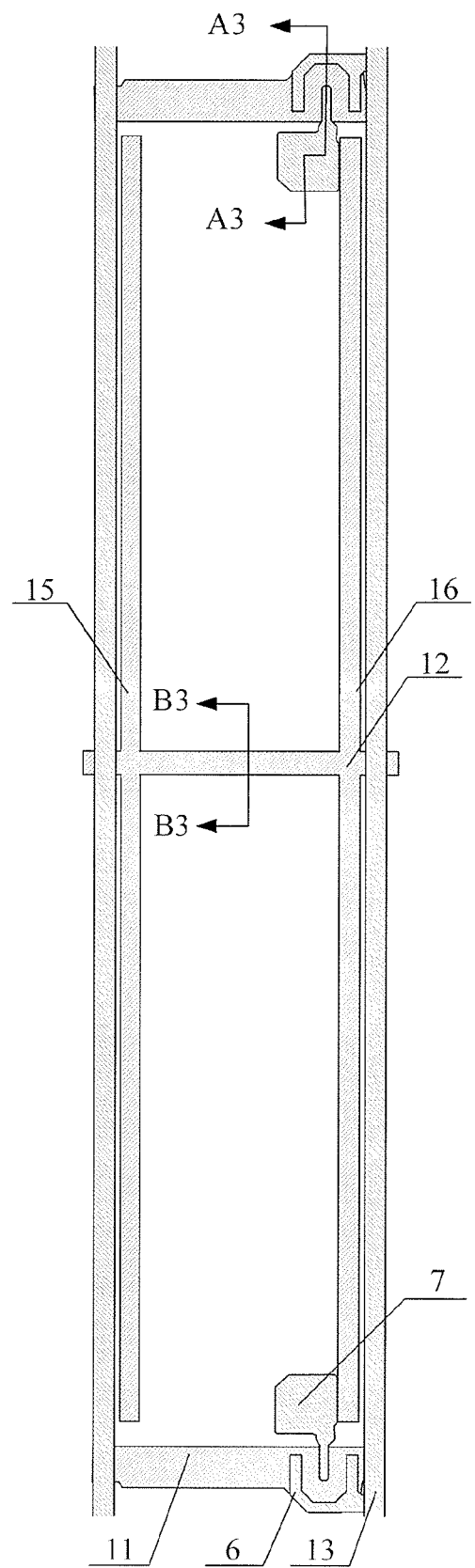
FIG. 8 is a plan view of the TFT-LCD array substrate after a second patterning process according to the embodiment of the invention.
Figure 9:
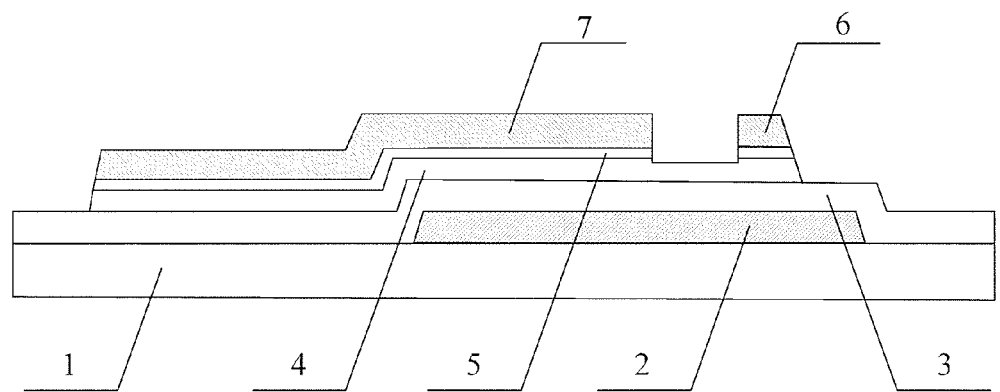
FIG. 9 is a cross-sectional view taken along line A3-A3 in FIG. 8.
Figure 10:
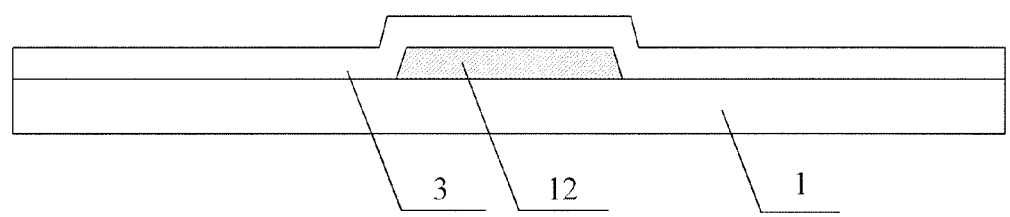
FIG. 10 is a cross-sectional view taken along line B3-B3 in FIG. 8.

FIG. 8 is a plan view of the TFT-LCD array substrate after a second patterning process according to the embodiment of the invention, which shows a structure of two vertically adjacent pixel regions. FIG. 9 is a cross sectional view taken along the line A3-A3 in FIG. 8, and FIG. 10 is a cross sectional view taken along the line B3-B3.

On the substrate 1 after the above process, a gate insulating film, a semiconductor film and a doped semiconductor film is deposited in this order by a plasma enhanced chemical vapor deposition (PECVD) method, then a source/drain metal film is deposited by a magnetic sputtering method or a thermal evaporation method. The gate insulating film may use oxide, nitride or oxynitride, and the source/drain metal film may use a single layer of a metal such as Mo, Al and etc., or use a single layer of a low resist metal such as Cu, or a composite film composed of multiple metal layers (e.g., Mo/Al/Mo composite film). The data line 13, a source electrode 6, a drain electrode 7 and a TFT channel region for each pixel region are formed by using a half tone mask or a grey tone mask, as shown in FIG. 8~10. This second patterning process may be a multi-step etching process and comprise the follow steps. Firstly, a layer of photoresist is applied on the source/drain metal film, and the photoresist is exposed with a half tone mask or a grey tone mask so as to form a completely-exposed region, a non-exposed regions and a partially-exposed region in the photoresist, in which the non-exposed region corresponds to the regions of the data line 13, the source electrode 6 and the drain electrode 7, the partially-exposed region corresponds to the TFT channel region between the source electrode 6 and the drain electrode 7, and the completely-exposed region corresponds to the remaining region. After the development of the photoresist, the thickness of the photoresist in the non-exposed region is not changed so as to form a photoresist-completely-retained region, the photoresist in the completely-exposed region is removed so as to form the photoresist-completely-removed region, and the photoresist in the partially-exposed region is reduced in thickness so as to form the photoresist-partially-retained region. The data line 13, the source electrode 6 and the drain electrode 7 are formed by etching away the source/drain metal film, the doped semiconductor film and the semiconductor film though a first etching process in the photoresist-completely-removed region. Then, the photoresist in the partially-exposed region is removed by an ashing process so as to expose the source/drain metal film in this region. The source/drain metal film and the doped semiconductor film in the partially-exposed region are etched away and the semiconductor film is etched partially in the thickness direction by a second etching process, so that the semiconductor film is exposed and the source drain 6, the drain electrode 7 and the TFT channel region are formed. Finally, the remaining photoresist is lifted off so as to complete the second patterning process for the TFT-LCD array substrate according to the embodiment. After the second patterning process, the gate insulating layer 3 covers the whole substrate 1. The semiconductor layer 4 and the doped semiconductor layer 5 constitute the active layer island on the gate insulating layer 3 and above the gate electrode 2. The source electrode 6 and the drain electrode 7 are formed on the active layer island. One end of the source electrode 6 is positioned above the gate electrode 2 and the other end is connected with the data line 13. One end of the drain electrode 7 is positioned above the gate electrode 2 and disposed oppositely to the source electrode 6. The TFT channel region is formed between the source electrode 6 and the drain electrode 7. In the TFT channel region, the doped semiconductor layer 5 is etched away and the semiconductor layer 4 in the region is etched partially in the thickness direction so as to expose the semiconductor layer 4 in the TFT channel region. The gate lines 11 and the data line 13 define the pixel region. The data line 13 is positioned at the outer side of the first light blocking bar 15 or the second light blocking bar 16, and the doped semiconductor film and the semiconductor film are also retained below the data line 13.

Figure 11:
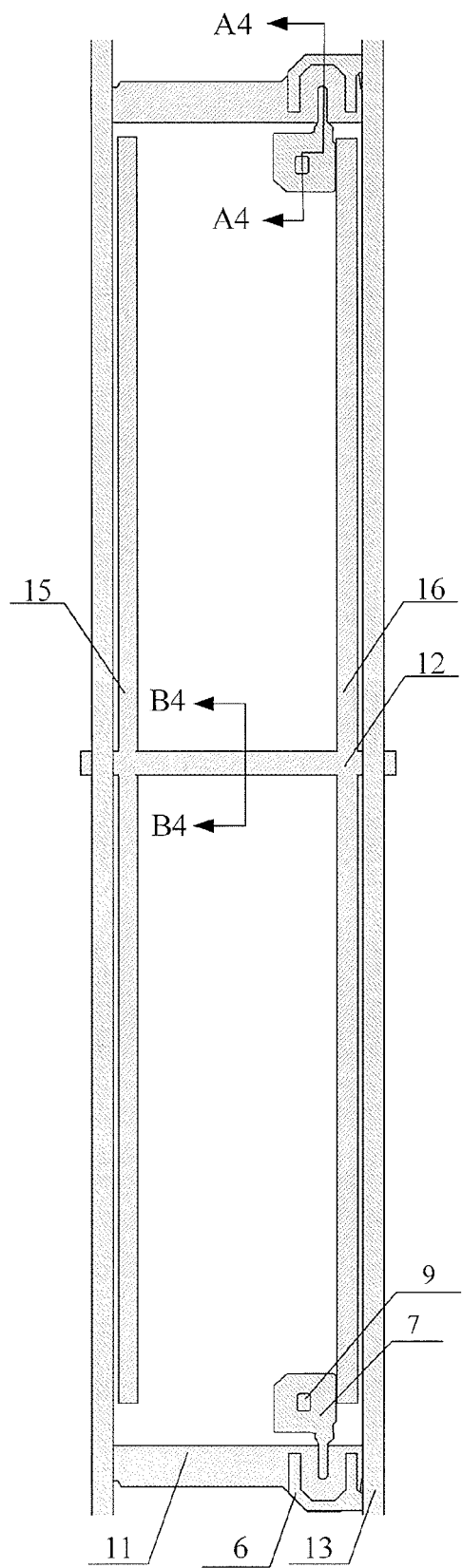
FIG. 11 is a plan view of the TFT-LCD array substrate after a third patterning process according to the embodiment of the invention.
Figure 12:
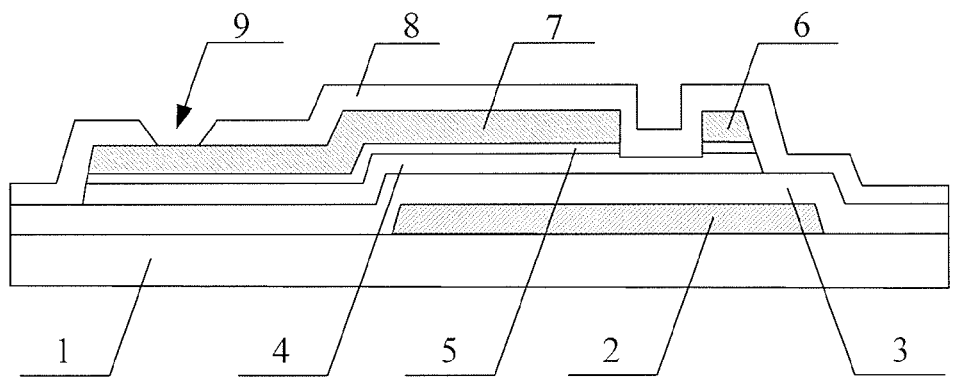
FIG. 12 is a cross-sectional view taken along line A4-A4 in FIG. 11.
Figure 13:
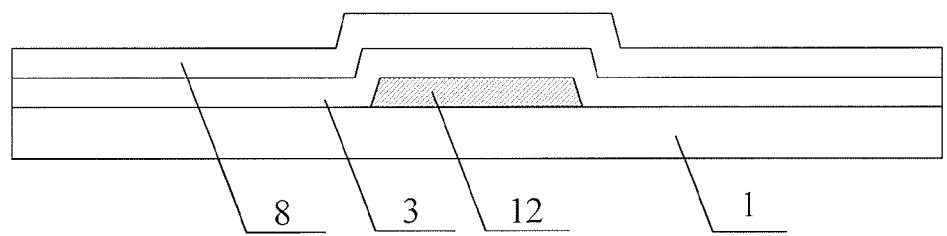
FIG. 13 is a cross-sectional view taken along line B4-B4 in FIG. 11.

FIG. 11 is a plan view of the TFT-LCD array substrate after a third patterning process according to the embodiment of the invention, which shows the structure of two vertically adjacent pixel regions. FIG. 12 is a cross sectional view taken along the line A4-A4 in FIG. 11, and FIG. 13 is a cross sectional view taken along the line B4-B4 in FIG. 11. On the substrate after the above processes, a passivation layer 8 is deposited by a plasma enhanced chemical vapor deposition (PECVD). The passivation layer 8 may use oxide, nitride or oxynitride. The passivation layer 8 is patterned with a normal mask so as to form a through hole 9 in the passivation layer 8 above the drain electrode 7, as shown in FIG. 11-13. In the patterning process, a through hole for a gate line pad region and a though hole for a data line pad region may be formed simultaneously.

Finally, on the substrate after the above processes, a transparent conductive film is deposited by a magnetic sputtering method or a thermal evaporation method. The transparent conductive film may use the materials such as indium tin oxide (ITO), indium zinc oxide (IZO) or aluminum zinc oxide, or may use other transparent metal or transparent metal oxide. The pixel electrode 14 is formed by a patterning process with a normal mask. The pixel electrode 14 is formed in each pixel region and connected with the corresponding drain electrode 7 through the passivation through hole 9. In the two vertically adjacent pixel regions, the pixel electrodes 14 cover the common electrode line 12, so that the pixel electrodes 14 and the common electrode line 12 form structures of capacitance on the common electrode line (Cst on Common).

The above mentioned four-patterning process (four mask process) is only one example of the manufacturing method of the TFT-LCD array substrate according to the embodiment of the invention. In practice, the number of the patterning processes may be increased or reduced, or different materials or different combination of materials may be employed. For example, the second patterning process for manufacturing the TFT-LCD array substrate according to the embodiment of the invention may be performed with two patterning processes by using two normal masks, i.e., forming the active layer island with one patterning process by using a normal mask, and forming the data line, the source electrode, the drain electrode and the TFT channel region with another patterning by using a normal mask. The example may comprise the following steps of: firstly, deposition a gate insulating film, a semiconductor film and a doped semiconductor film subsequently with a PECVD method, then forming an active layer island, with a patterning process by using a normal mask, that comprises a stack of semiconductor layer and a doped semiconductor layer on the gate insulating layer and above the gate electrode; thereafter, depositing a layer of source/drain metal film with a magnetic sputtering method or a thermal evaporation method; then, forming the data line, the source electrode, the drain electrode and the TFT channel region with a patterning process by using a normal mask. One end of the source electrode is on the active layer island and the other end is connected with the data line. One end of the drain electrode 7 is on the active layer island and disposed oppositely to the source electrode. The TFT channel region is formed between the source electrode and the drain electrode. The doped semiconductor layer in the TFT channel region is etched away and the semiconductor layer in the region is etched partially in the thickness so as to expose the semiconductor film in the TFT channel region. After the patterning process, only the gate insulating film is retained below the data line.

It should be noted that the thin film transistors in the two vertically adjacent pixel regions are positioned at the same side is shown in the above embodiment. But for those skilled in the art, the thin film transistors may also be positioned on the two opposite sides of the two vertically adjacent pixel regions, which structure is also applicable in the embodiment of invention and the description for which is omitted here.

The embodiment of the invention provides a TFT-LCD array substrate having a structure of the common electrode line being common to two vertically adjacent pixel regions. With the configuration of array substrate according to the embodiment, the aspect ratio can be increased effectively without adversely affecting the display quality. By comparing the structure of one common electrode line provided for each pixel region, the TFT-LCD array substrate according to the embodiment can reduce one common electrode line for each group comprising two vertically adjacent pixel regions, so that the aspect ratio can be increased effectively, the power consumption of the backlight can be reduced effectively with the display brightness unchanged, and the product cost can be decreased for the TFT-LCD array substrate. In addition, the TFT-LCD array substrate may be formed by using a four-patterning process or a five-patterning process, so that the performance and the quality of the TFT-LCD are increased without additional patterning process.

The manufacturing method of the TFT-LCD array substrate according to an embodiment of the invention may comprise the following steps.

Step 1 of depositing a gate metal film on a substrate, forming a gate line, a gate electrode and a common electrode line for each pixel region by patterning the gate metal film. The common electrode line is common to two vertically adjacent pixel regions.

Step 2 of depositing a gate insulating layer, a semiconductor film, and a doped semiconductor film and a source/drain metal film on the substrate after Step 1, forming an active layer island, a data line, and a drain electrode, a source electrode and a TFT channel for each pixel region by patterning the gate insulating layer, the semiconductor film, the doped semiconductor film and the source/drain metal film.

Step 3 of depositing a passivation layer on the substrate after Step 2, forming a through hole in the passivation layer above the drain electrode by patterning the passivation layer.

Step 4 of depositing a transparent conductive film on the substrate after Step 3, forming a pixel electrode of each pixel region, which is connected with the drain electrode through the passivation through hole, by patterning the transparent conductive film.

In the manufacturing method of the TFT-LCD array substrate according to the embodiment of the invention, the aspect ratio can be increased effectively without adversely affecting the display quality by commonly using one pixel region for two vertically adjacent pixel regions. By comparing the structure of one common electrode line provided for each pixel region, the TFT-LCD array substrate according to the embodiment may reduce one common electrode line for each group comprising two vertically adjacent pixel regions, so that the aspect ratio can be increased effectively, the power consumption of the backlight can be reduced effectively with the display brightness unchanged, and the product cost can be decreased for the TFT-LCD array substrate. In addition, The TFT-LCD array substrate may use a four-patterning process or a five-patterning process, so that the performance and the quality of the TFT-LCD can be increased without additional patterning process.

In Step 1, a first light blocking bar and a second light blocking bar connected with the common electrode line may be further formed. The first light blocking bar and the second light blocking bar are parallel with the data line and positioned at the two sides of the two vertically adjacent pixel regions. Firstly, a gate metal film is deposited on a substrate (e.g., a glass substrate or a silica substrate) by a magnetic sputtering and a thermal evaporation method. The gate metal film may use a single film of a metal such as Mo and Al, or may use a composite film composed of multiple metal layers (e.g., Mo/Al/Mo composite film). The gate metal film is patterned by a normal mask (single tone mask) so as to form a gate line, a gate electrode, a common electrode line, a first light blocking bar and a second light blocking bar for each pixel region. The common electrode line is positioned between two vertically adjacent pixel regions and parallel with the gate lines of the two pixel regions. The first light blocking bar and the second light blocking bar are parallel with the data lines. The first light blocking bar is at the left side of the pixel regions and closer to the data line at the left side of the pixel regions; the second light blocking bar is at the right side of the pixel regions and closer to the data line at the right side of the pixel regions. The common electrode line is connected with the first and second light blocking bars, so that a integral structure of the common electrode line, the first and second light blocking bars forms a light blocking bar structure of a "Π" shape or a reversed "Π" shape for each pixel region. That is to say, the common electrode line is commonly used for the two vertically adjacent pixel regions.

In a first example of the manufacturing method of the TFT-LCD array substrate according to the embodiment of the invention, Step 2 may comprise the following sub-steps.

Step 11 of depositing the gate insulating layer, the semiconductor film and the doped semiconductor film on the substrate after Step 1 by a plasma enhanced chemical vapor deposition method.

Step 12 of depositing the source/drain metal film on the substrate after Step 11 by a magnetic sputtering method or a thermal evaporation method.

Step 13 of applying a layer of photoresist on the source/drain metal film.

Step 14 of exposing the photoresist by using a half tone mask or a grey tone mask, so as to form a photoresist-completely-retained region, a photoresist-completely-removed region and a photoresist-partially-retained region. The photoresist-completely-retained region corresponds to the regions of the data line, the source electrode and the drain electrode, the photoresist-partially-retained region corresponds to the TFT channel region between the source electrode and the drain electrode, and the photoresist-completely-removed region corresponds to the remaining region. After developing of the photoresist, the thickness of the photoresist in the photoresist-completely-retained region remains unchanged, the photoresist in the photoresist-completely-removed region is removed completely, and the thickness of the photoresist in the photoresist-partially-retained region is reduced.

Step 15 of etching away the source/drain metal film, the doped semiconductor film and the semiconductor film in the photoresist-completely-removed region by a first etching so as to form the active layer island and the data line.

Step 16 of exposing the source/drain metal film in the photoresist-partially-retained region by removing the photoresist in the region with an ashing process.

Step 17 of etching away the source/drain metal film and the doped semiconductor film and partially etching the semiconductor film in the thickness direction in the photoresist-partially-retained region by a second etching process, so that the semiconductor film in the region is exposed and the source electrode, the drain electrode and the TFT channel region are formed for each pixel region.

Step 18 of lifting off the remaining photoresist.

This example includes a method to simultaneously form the active layer island, the data line, the source electrode, the drain electrode and the TFT channel region for each pixel region in one patterning process by using a half tone or gray tone mask. The pixel region after the above steps is shown in FIGS. 9 and 10.

In a second example of the manufacturing method of the TFT-LCD array substrate according to the embodiment of the invention, Step 2 may comprise the following sub-steps.

Step 21 of depositing the gate insulating layer, the semiconductor film and the doped semiconductor film subsequently on the substrate after Step 1 by a plasma enhanced chemical vapor deposition method.

Step 22 of forming the active layer island by a patterning process with a normal mask.

Step 23 of depositing the source/drain metal film on the substrate after Step 22 by a magnetic sputtering method or a thermal evaporation method.

Step 24 of forming the data line, the source electrode, the drain electrode and the TFT channel region for each pixel region by a patterning process with a normal mask.

This example includes a method using two patterning processes with a normal mask, i.e., forming the active layer island by a patterning process with a normal mask, forming the data line, the source electrode, the drain electrode and the TFT channel region by a patterning process with a mask.

In Step 3, the passivation layer may be deposited by a PECVD method, and the passivation layer is patterned with a normal mask so as to form the through hole in the passivation layer above the drain electrode. The pixel structure after the step is shown in FIGS. 12 and 13.

In Step 4, the transparent conductive is deposited by a magnetic sputtering method or a thermal evaporation method, and the pixel electrode is formed by the patterning process with a normal mask. The pixel electrode is formed in each pixel region and connected with the drain electrode though the passivation through hole. For the group comprising two vertically adjacent pixel regions, the common electrode line is between the gate lines of the two vertically adjacent pixel regions and parallel with the gate lines of the two vertically adjacent pixel regions. The first light blocking bar and the second light blocking bar are parallel with the data lines of the two vertically adjacent pixel regions with the first light blocking bar being at the left side of the pixel regions and closer to the data line at the light side of the pixel regions and the second light blocking bar 16 being at the right side of the pixel regions and closer to the data line at the right side of the pixel regions. The common electrode line is connected with the first light blocking bar and the second light blocking bar so that the integral structure of the common electrode line, the first and second light blocking bar form a light blocking structure of a "Π" shape or a reversed "Π" shape for each pixel region. Each of the pixel electrode and the common electrode line are overlapped with each other, so that the pixel electrode and the common electrode line form a structure of capacitance on the common electrode line (Cst on Common).

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. A manufacturing method of a thin film transistor liquid crystal display (TFT-LCD) array substrate, comprising:

Step 1 of depositing a gate metal film on a substrate, forming a gate line, a gate electrode and a common electrode line for each pixel region by patterning the gate metal film, wherein the common electrode line is common to two vertically adjacent pixel regions;

Step 2 of depositing a gate insulating layer, a semiconductor film, and a doped semiconductor film and a source/drain metal film on the substrate after Step 1, forming an active layer island, a data line, and a drain electrode, a source electrode and a thin film transistor (TFT) channel for each pixel region by patterning the gate insulating layer, the semiconductor film, the doped semiconductor film and the source/drain metal film;

Step 3 of depositing a passivation layer on the substrate after Step 2, forming a through hole in the passivation layer above the drain electrode by patterning the passivation layer; and Step 4 of depositing a transparent conductive film on the substrate after Step 3, forming a pixel electrode of each pixel region, which is connected with the drain electrode through the passivation through hole, by patterning the transparent conductive film, wherein, forming the active layer island, the data line, and the drain electrode, the source electrode and the TFT channel by patterning the gate insulating layer in Step 2 comprises:

on the substrate after Step 1, depositing the gate insulating layer, the semiconductor film and the doped semiconductor film sequentially by a plasma enhanced chemical vapor deposition method, and subsequently, depositing the source/drain metal film by a magnetic sputtering method or a thermal evaporation method;

applying a layer of photoresist on the source/drain metal film;

exposing the photoresist by using a half tone mask or a grey tone mask, so as to form a photoresist-completely-retained region, a photoresist-completely-removed region and a photoresist-partially-retained region, wherein the photoresist-completely-retained region corresponds to the regions of the data line, the source electrode and the drain electrode, the photoresist-partially-retained region corresponds to the TFT channel region between the source electrode and the drain electrode, and the photoresist-completely-removed region corresponds to the remaining region; after developing the photoresist, the thickness of the photoresist in the photoresist-completely-retained region remains unchanged, the photoresist in the photoresist-completely-removed, region is removed completely, and the thickness of the photoresist in the photoresist-partially-retained region is reduced;

etching away the source/drain metal film, the doped semiconductor film and the semiconductor film in the photoresist-completely-removed region by a first etching so as to form the active layer island and the data line;

removing the photoresist in the photoresist-partially-retained region to expose the source/drain metal film;

etching away the source/drain metal film and the doped semiconductor film and partially etching the semiconductor film in the thickness direction in the photoresist-partially-retained region by a second etching process, so that the semiconductor film in the photoresist-partially-retained region is exposed and the source electrode, the drain electrode and the TFT channel region are formed; and lifting off the remaining photoresist.

2. The manufacturing method of the TFT-LCD array substrate of claim 1, wherein a first light blocking bar and a second light blocking bar that are connected with the common electrode line is formed simultaneously, and the first light blocking bar and the second light blocking bar are parallel with the data line and positioned at the two sides of each pixel region.

3. The manufacturing method of the TFT-LCD array substrate of claim 2, wherein a first light blocking bar and a second light blocking bar that are connected with the common electrode line is formed simultaneously, and the first light blocking bar and the second light blocking bar are parallel with the data line and positioned at the two sides of each pixel region.

4. A manufacturing method of a thin film transistor liquid crystal display (TFT-LCD) array substrate, comprising:

Step 1 of depositing a gate metal film on a substrate, forming a gate line, a gate electrode and a common electrode line for each pixel region by patterning the gate metal film, wherein the common electrode line is common to two vertically adjacent pixel regions;

Step 2 of depositing a gate insulating layer, a semiconductor film, and a doped semiconductor film and a source/drain metal film on the substrate after Step 1, forming an active layer island, a data line, and a drain electrode, a source electrode and a thin film transistor (TFT) channel for each pixel region by patterning the gate insulating layer, the semiconductor film, the doped semiconductor film and the source/drain metal film;

Step 3 of depositing a passivation layer on the substrate after Step 2, forming a through hole in the passivation layer above the drain electrode by patterning the passivation layer; and Step 4 of depositing a transparent conductive film on the substrate after Step 3, forming a pixel electrode of each pixel region, which is connected with the drain electrode through the passivation through hole, by patterning the transparent conductive film, wherein forming the active layer island, the data line, and the drain electrode, the source electrode and the TFT channel by patterning the gate insulating layer in Step 2 comprises:

on the substrate after Step 1, depositing the gate insulating layer, the semiconductor film and the doped semiconductor film sequentially by a plasma enhanced chemical vapor deposition method; forming the active layer island by a patterning process with a normal mask;

depositing the source/drain metal film by a magnetic sputtering method or a thermal evaporation method; and forming the data line, the source electrode, the drain electrode and the TFT channel region by a patterning process with a normal mask.

* * * * *